United States Patent
Ohkohdo et al.

(10) Patent No.: US 6,345,902 B2
(45) Date of Patent: Feb. 12, 2002

(54) LIGHT EMITTING DIODE MOUNTING STRUCTURE

(75) Inventors: Masaya Ohkohdo; Hirokazu Sakata, both of Isehara (JP)

(73) Assignee: Ichikoh Industries, Ltd., Tokyo (JP)

( * ) Notice: Subject to any disclaimer, the term of this patent is extended or adjusted under 35 U.S.C. 154(b) by 0 days.

(21) Appl. No.: 09/766,837

(22) Filed: Jan. 23, 2001

Related U.S. Application Data

(62) Division of application No. 09/440,145, filed on Nov. 15, 1999.

(30) Foreign Application Priority Data

Nov. 17, 1998 (JP) .......................................... 10-326941
Nov. 1, 1999 (JP) ............................................. 11-4434

(51) Int. Cl.$^7$ .............................................. F21V 21/00
(52) U.S. Cl. ...................... 362/226; 362/391; 362/800; 362/249; 439/391
(58) Field of Search ................................ 362/226, 249, 362/252, 800, 391; 439/391, 397, 395

(56) References Cited

U.S. PATENT DOCUMENTS

| | | | | |
|---|---|---|---|---|
| 4,555,749 A | * | 11/1985 | Rifkin et al. | 362/249 |
| 4,631,650 A | * | 12/1986 | Ahroni | 362/249 |
| 4,935,856 A | * | 6/1990 | Dragoon | 362/307 |
| 4,959,761 A | * | 9/1990 | Critelli et al. | 362/226 |
| 5,622,425 A | * | 4/1997 | Lin | 362/249 |
| 6,079,848 A | * | 6/2000 | Ahroni | 362/249 |

FOREIGN PATENT DOCUMENTS

JP 10-188614 7/1998

\* cited by examiner

*Primary Examiner*—Thomas M. Sember
(74) *Attorney, Agent, or Firm*—Foley & Lardner

(57) ABSTRACT

A light emitting diode mounting structure for a light emitting diode having four leads has two metal plates fixed to wire on a housing. The leads engage the metal plates in electrical contact therewith and are supported by the metal plates, a surface part of which reflects light from the light emitting diode.

6 Claims, 5 Drawing Sheets

LIGHT EMITTING DIODE MOUNTING STRUCTURE

This application is a Divisional application of Ser. No. 09/440,145, filed Nov. 15, 1999

BACKGROUND OF THE INVENTION

1. Field of the Invention

The present invention relates to a light emitting diode mounting structure, and more particularly to a light emitting diode mounting structure that is suitable for application to a vehicular lamp.

2. Description of the Related Art

The leads of a light emitting diode used in such applications as vehicular lamps are soldered to a printed circuit board that is provided on the lamp, according to, for example, the disclosure of the Japanese laid-open patent application publication H10-188614.

In a structure whereby a light emitting diode is soldered to a printed circuit board, however, if the light axis of the light emitting diode is shifted because of such effects as deformation of the leads, there is possibility that the effective rate of usage of the light from the light emitting diode drops. For this reason, in order to achieve the required brightness, it is necessary to use a large number of light emitting diodes, this being a disadvantage from the standpoint of cost.

Additionally, because each of the leads of the light emitting diode is soldered to the printed circuit board individually, the process of mounting the light emitting diode to the board is troublesome, and manufacturing efficiency is poor. When replacing a light emitting diode, the process of removing leads from their positions on the printed circuit board and resoldering leads is complex.

Accordingly, in view of the related art, it is an object of the present invention to provide a light emitting diode mounting structure with superior light usage and work efficiency.

SUMMARY OF THE INVENTION

To achieve the above-noted object, the first aspect of a structure according to the present invention has a light emitting diode having a lead, and a metal plate fixed and connected to a wire on an upper housing. The lead engages the metal plate so as to make an electrical connection therewith, and is support thereby. The surface part of the metal plate has a surface area that is capable of reflecting light from the light emitting diode.

In the above-noted configuration, a surface part having a surface area capable of reflecting the light of the light emitting diode is formed on the metal plate. For this reason, the light usage efficiency of the light emitting diode is improved, the result being that a smaller number of light emitting diodes can be used to achieve the required brightness, thereby simplifying the structure and reducing the cost.

The above-noted light emitting diode can also have four leads, these leads being engaged with two metal plates that are disposed in proximity.

In the above-noted configuration, because there are four leads, the light emitting diode does not tend to bend over and does not tend to change its direction after mounting. Additionally, because two metal plates are used to mount one light emitting diode, the size of one metal plate can be made small, thereby facilitating manufacture of the metal plates. Additionally, because the two metal plates are in mutual proximity, there is little affect on the rate of usage of the light.

The lead can be formed of a metal that has a thermal conductivity that is equivalent to or greater than that of copper.

In the above-noted configuration, because the lead is formed of a metal having a thermal conductivity that is equivalent to or greater than of copper, heat that is generated by the light emitting diode is reliably transmitted via the lead to the metal plate, where it is radiated from the surface part thereof. There is thus an improvement in the heat radiation of the light emitting diode.

The wire can be formed by an insulation covering and a center conductor disposed within the insulation cover, and the metal plate can be formed by a foot part that faces the housing, and a cutting groove part that is formed in the end of the foot part. When the wire is inserted into the cut groove part, the cutting groove cuts the insulation covering of the wire, and eats thereinto, the effect being that the metal plate comes into a conductive connection with the center conductor, and holds the wire in place.

In the above-noted configuration, a cutting groove formed in the foot part of the metal plate cuts the insulation covering of the wire and bites into the inside thereof so that an electrical connection is made to the center conductor, the biting force between the cutting groove and the wire also serving to hold the light emitting diode in one operation to the wire. For this reason, it is not necessary to perform a soldering operation to mount the light emitting diode in place, and it easy to replace the light emitting diode. Additionally, because it is possible to use the surface part of the metal plate as a surface for an operator to press with a finger, the operation of pressing the metal plate to press the wire into the cutting groove is facilitated.

The surface part of the metal plate can also be a surface that is colored with a metallic coloring.

In the above-noted configuration, because a metallic coloring is imparted to the surface part of the metal plate, good reflection of light is achieved, thereby further improving the usage of light.

The construction of the second embodiment of the present invention has two light emitting diodes each having a lead, and two metal plates each being connected to a wire on an upper housing. The leads engage with the metal plates so as to make an electrically conductive connection thereto. Each metal plate has a hole for the purpose of connecting a jumper wire between the metal plates.

In the above-noted configuration, even if the wire between neighboring metal plates is broken, because of the connection made by the jumper wire between the metal plates, it is possible to maintain the electrical connection between the metal plates.

The mounting structure according to the third embodiment has a light emitting diode having a lead, a non-metallic holder that engages with a housing, and a metal connecting member that is mounted to the holder. The connecting member has an integrally formed foot part and clip part. The lead is resiliently grabbed and supported by the clip part. The foot part has at its end a cutting groove that accepts the wire on the housing. The wire is formed by an insulation covering and a center conductor disposed therewithin. When the wire is inserted into the cutting groove, the cutting groove cuts the insulation covering of the wire and bites into the inside thereof, thereby making an electrically conducting connection between the connecting member and the center conductor, and also holding the wire in place.

In the above-noted configuration, because of the connecting member that is mounted to a holder engaged with the housing, the connecting member is securely held to the housing. Because the light emitting diode is resiliently grabbed and supported by the clip part of the connecting member, it is held in place with respect to the housing. As a result, the light emitting diode is held securely to the housing, thereby resulting in a stable light axis. Because the light axis of the light emitting diode is stabilized in this manner, there is an improvement in the usage of the light thereof. For this reason, the number of light emitting diodes required to achieve the desired brightness is reduced, thereby simplifying the structure and reducing the cost. Additionally, because the cutting groove formed in the foot part of the connecting member bites into the inside of the wire insulation covering, the biting force between the cutting groove and the wire holds the wire in place with a single operation. Additionally, it is possible to hold the light emitting diode in place by inserting the wire into the clip part, thereby eliminating the need of a soldering operation to hold the lead in place, thereby simplifying the mounting task. This not only improves manufacturing efficiency and enables automation thereof, but also facilitates replacement of the light emitting diode.

The light emitting diode can have four leads, the holder can have two neighboring connecting members mounted to it, and each connecting member can have two clip parts. It is also possible for each of the connecting members to have two cutting grooves. The four leads are each grabbed and supported by the clip parts.

In the above-noted configuration, because a single light emitting diode is held in place by two connecting members, the size of each connecting member is reduced, thereby facilitating the manufacture of the connecting members.

The clip parts can be exposed from the holder, in which case because of the exposure of the clip parts from the holder heat generated by the light emitting diode is radiated from the clip parts, thereby improving the heat radiation performance of the light emitting diode.

The leads can be formed of a metal that has a thermal conductivity equivalent to or greater than that of copper.

In the above-noted configuration, because the leads are made of a metal that has a thermal conductivity equivalent to or greater than that of copper, heat generated by the light emitting diode is reliably transmitted to the metal plates via the leads, and is radiated from the clip parts. There is therefore a further improvement in the heat radiation performance of the light emitting diode.

DESCRIPTION OF THE PREFERRED EMBODIMENTS

Preferred embodiments of the present invention are described below in detail, with references being made to relevant accompanying drawings.

FIG. 1 through FIG. 4 illustrate the first embodiment of the present invention. This embodiment will be described with regard to application to a vehicular stop lamp.

Figure 1:
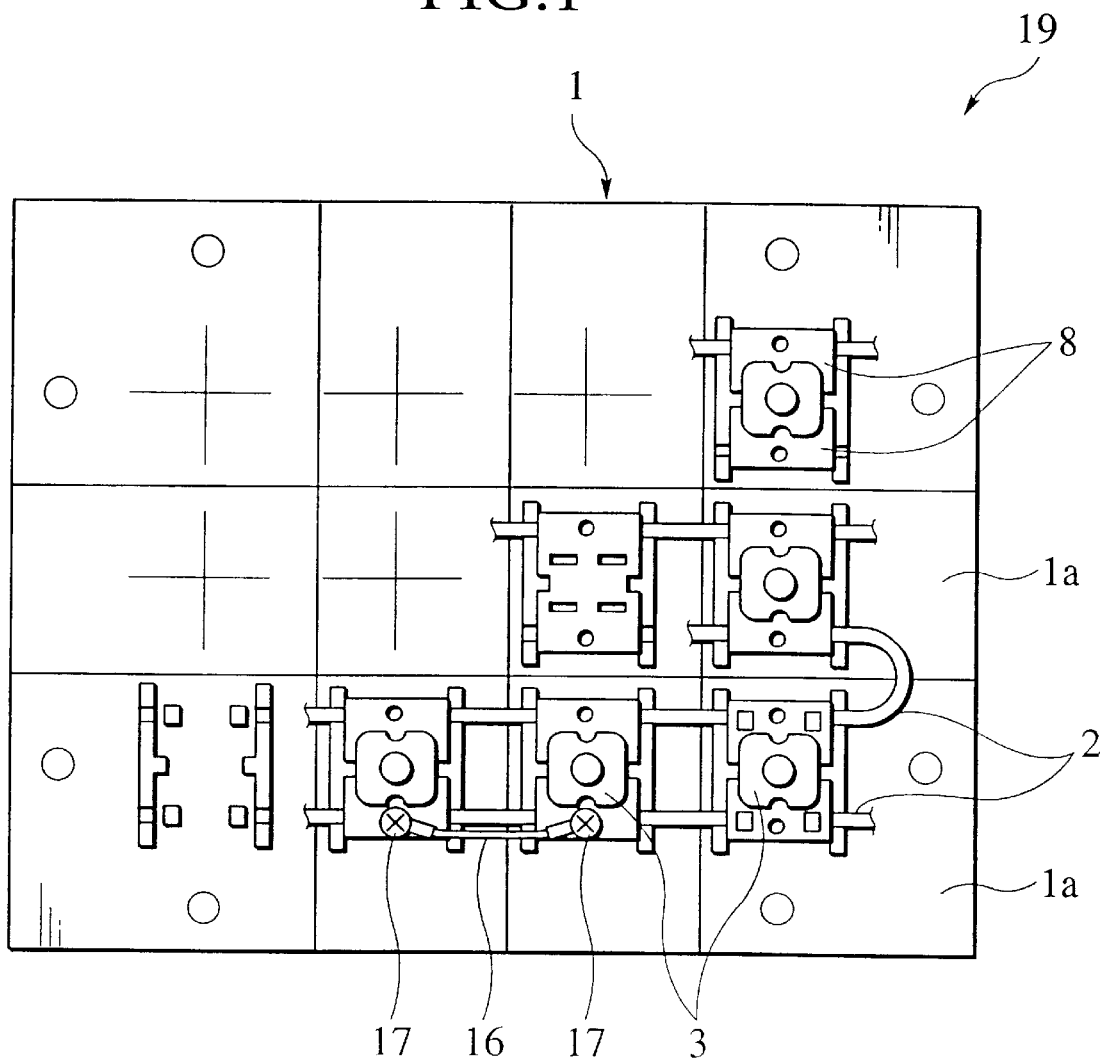
FIG. 1 is a plan view showing a light emitting diode according to the first embodiment of the present invention.
Figure 2:
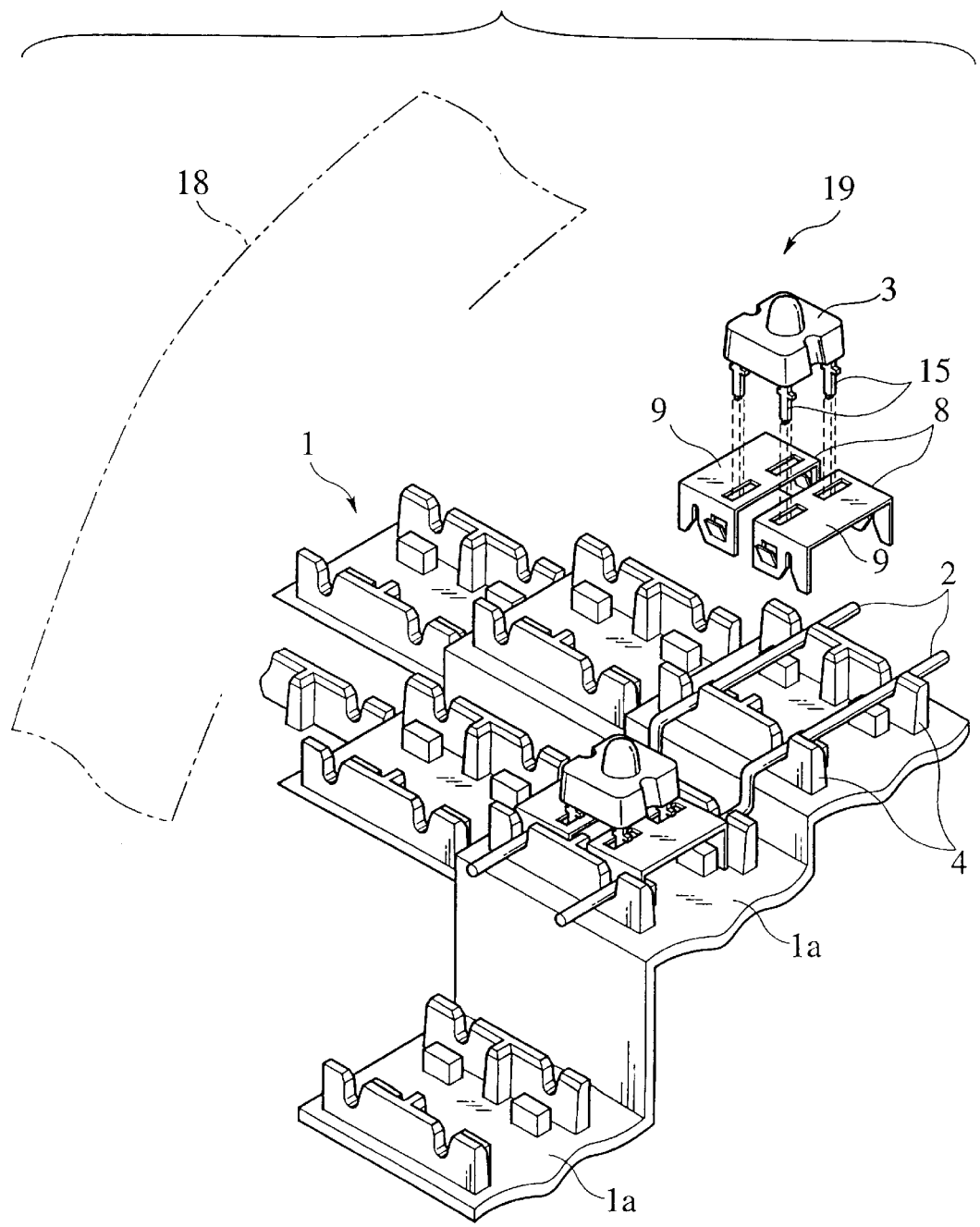
FIG. 2 is a perspective view showing the structure of the light emitting diode of FIG. 1.

As shown in FIG. 1, a housing 1 is provided on the inside of a lens 18 of a stop lamp 19. The stop lamp 19 (lens 18), as shown in FIG. 2, has a three-dimensional shape that is continuous with the outside contour of the surface of the vehicle. For this reason, the housing 1 has a plurality of mounting surfaces 1a that are disposed in three-dimensionally skewed levels so as to follow the shape of the stop lamp 19. Two wires 2 are disposed in parallel so as to pass each mounting surface 1a. A light emitting diode 3 is mounted to the wires 2. The wires 2 are each formed by a center conductor 2a and an insulation covering 2b. Because each of the mounting structures for the light emitting diodes on the mounting surfaces 1a is substantially the same, the description below is provided for only one exemplary mounting surface 1a, based on FIG. 3.

Figure 3:
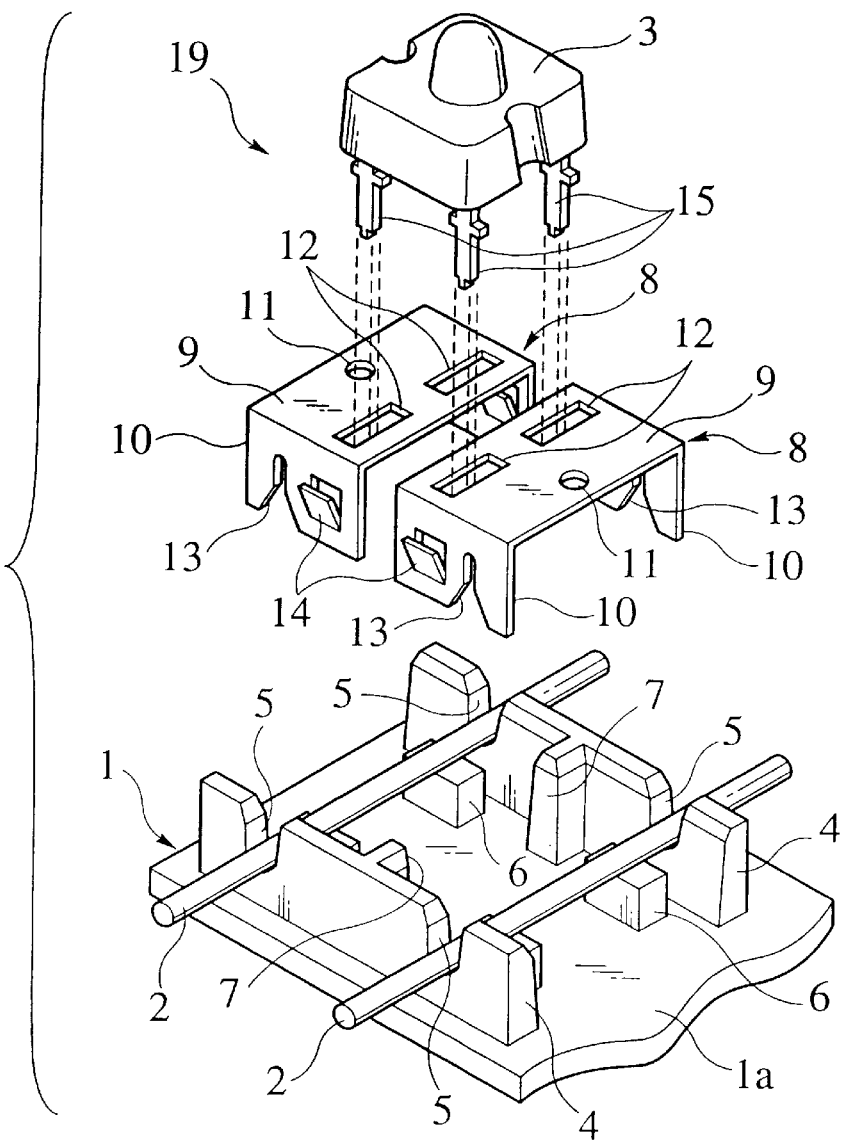
FIG. 3 is a partial perspective view showing the structure of the light emitting diode of FIG. 1.

As shown in FIG. 3, two walls 4 are formed on the mounting surface 2a so as to face each other. The wires 2 are fitted into the cutouts 5 that are formed at the upper edges of the walls 4. A base 6 for supporting the wires 2 is formed at the bottom side of the cut-outs 5. A rib 7 for improving rigidity is formed at the center of each wall 4.

A metal plate 8 is formed by a surface part 9, and foot parts 10 formed by bending the ends the surface part 9 toward the mounting surface 1a. The part of the surface part 9 that is covered by the light emitting diode 3 supports the light emitting diode 3. The part of the surface part 9 that is not covered by the light emitting diode 3 is exposed in a wide area at the outside of the side of the light emitting diode 3, and reflects light from the light emitting diode 3. That is, the surface part 9 has a surface area that can reflect light from the light emitting diode 3.

One hole 11 is formed in each end of the surface part 9. The surface part 9 has a highly reflective metallic (silver) color imparted to it. There is a pair of two nearby opposing slits 12 punched out of the surface part 9. A downwardly open groove 13 and a outwardly open partially cut tab 14 are formed in the ends of the foot parts 10. The light emitting diode 3 has leads 15 at each of its four corners. The leads 15 are formed of copper, which has good thermal conductivity.

The process of mounting the housing in place is as follows.

First, the leads 15 of the light emitting diode 3 are inserted into the slits 12 of each of the metal plates 8. Next, the cutting grooves 13 of the metal plates 8 are set over the wires 2, and the surface parts 9 of the metal plates 8 are pressed so as to push the cutting grooves 13 over the wires 2. Because of the surface parts 9 in the area surrounding the light emitting diode 3, it is possible to use this surface part 9 as a surface to press with the finger, thereby facilitating the task of pressing the metal plates 8 over the wires 2.

Figure 4:
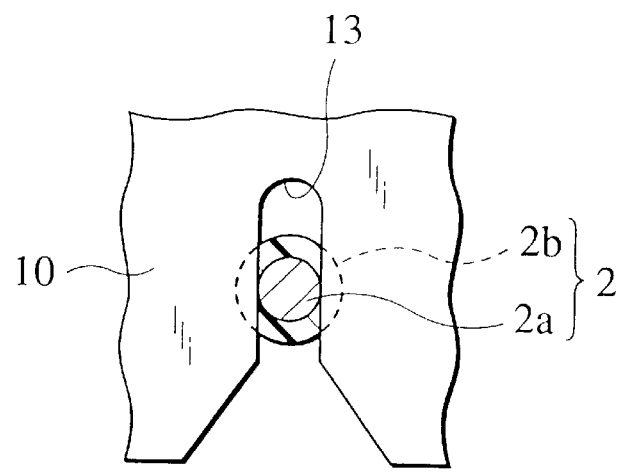
FIG. 4 is a cross-section view showing the wire and cutting groove of FIG. 3.

When the cutting grooves 13 are pressed over the wires 2, the cutting grooves 13 cut the insulation covering 2b of the wires 2, and bite into the inside thereof, thereby making an electrical connection with respect to the center conductors 2a of the wires 2 (refer to FIG. 4). The biting force between the cutting grooves 13 and the wires 2 holds the light emitting diode 3 in place over the wires 2, and there is an electrically conductive connection via the metal plates 8 between the light emitting diode 3 an the wires 2. Because the wires 2 are supported from the bottom by the bases 6, there is a secure pressure pushing the cutting groove onto the wires 2. The foot parts 10 of the metal plates 8 fit between the mutually opposing walls 4, and the bent partial cutouts 14 on the foot parts 10 thereof make a resilient connection with the walls 4. For this reason, movement with respect to the mounting position of the metal plates 8 is restricted, so that the metal plates 8 are held securely and stably in place.

It is thus possible to press the cutting grooves 13 over the wires 2 with a single operation, thereby eliminating the need to perform a soldering operation with respect to the leads 15 in order to hold the light emitting diode 3 in place. The process of mounting the light emitting diode 3 in place is therefore simplified, thereby improving manufacturing efficiency and enabling automation thereof. Additionally, replacement of the light emitting diode is facilitated.

Because the mounted light emitting diode 3 has four leads 15, it does not bend over after mounting, so that there is no tendency for the orientation of the light emitting diode 3 to change after mounting. Additionally, because a single light emitting diode 3 is held in place by two metal plates 8, it is possible to make the size of each metal plate 8 small, thereby simplifying the manufacture of the metal plates 8.

The light of the mounted light emitting diode 3 is reliably reflected by the surface part 9 of the metal plate 8, which has had a metallic coloring imparted thereto, the result being an improvement in the usage of light from the light emitting diode 3. Therefore, for a given brightness the number of light emitting diodes 3 required is reduced, thereby simplifying the lamp structure and reducing the cost. The light emitting diode 3 is supported by two metal plates 8, which are disposed in mutual proximity and have substantially the same shape, thereby improving the efficiency of usage of the light.

Because the leads 15 of the light emitting diode 3 are made of copper, which has a high thermal conductivity, heat generated from the light emitting diode 3 is reliably transmitted to the metal plates 8 via the leads 15, and is radiated from the broad surface parts 9 thereof, thereby improving the radiation of heat from the light emitting diode 3.

Additionally, there is one hole 11 each formed in the surface parts 9 of the metal plates 8. Even if there is an open connection between a wire 2 an d a neighboring metal plate 8, by holding a jumper wire 16 to the hole 11 of each metal plate 8 using screws 17, as shown in FIG. 1, an electrical connection is made between metal plates 8. Because of consideration given to countermeasures in the case of unexpected accidents, the reliability of the structure is high.

The housing 1 has a plurality of mounting surfaces 1a has a plurality of mounting surfaces 1a that are disposed in three-dimensionally skewed levels so as to follow the shape of the stop lamp 19, with the light emitting diodes 3 disposed on each mounting surf ace 1a. By thusly disposing each light emitting diode 3 in a positional that is optimal with respect to the lens (not shown in the drawing) of the stop lamp 19, there is a further improvement in the efficiency use of the light therefrom.

The second embodiment of the present invention is described below, with references being made to FIG. 5 to FIG. 8.

A housing 21 is provided on the inside of a lens 38 of a vehicular stop lamp 39. The stop lamp 39 (lens 38) has a three-dimensional shape that follows the shape of the body of the vehicle. For this reason, the housing 21 has a plurality of mounting surfaces 1a that are disposed in three-dimensionally skewed levels so as to follow the shape of the stop lamp 39.

Figure 5:
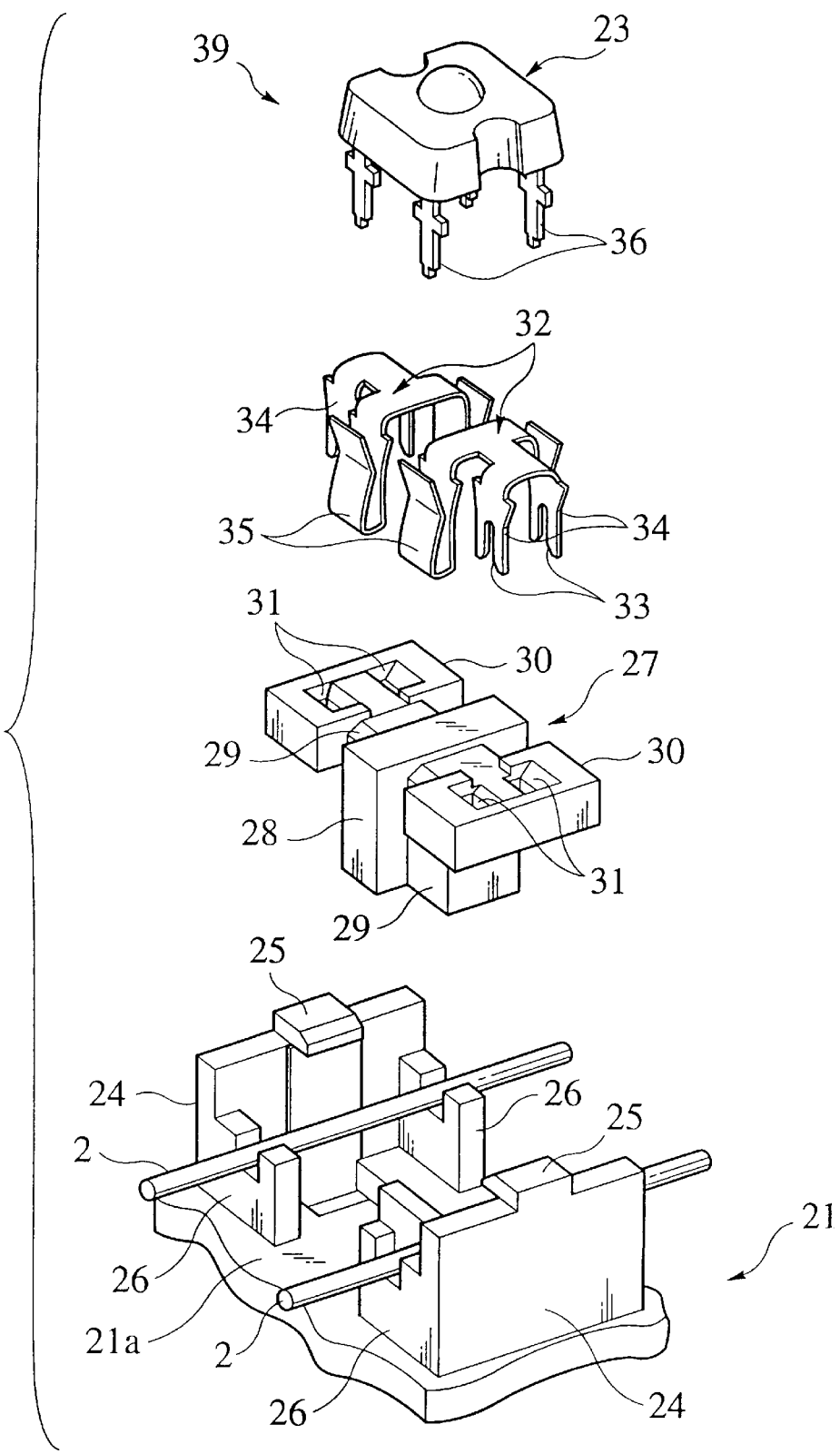
FIG. 5 is an exploded perspective view showing a light emitting diode according to the second embodiment of the present invention.
Figure 6:
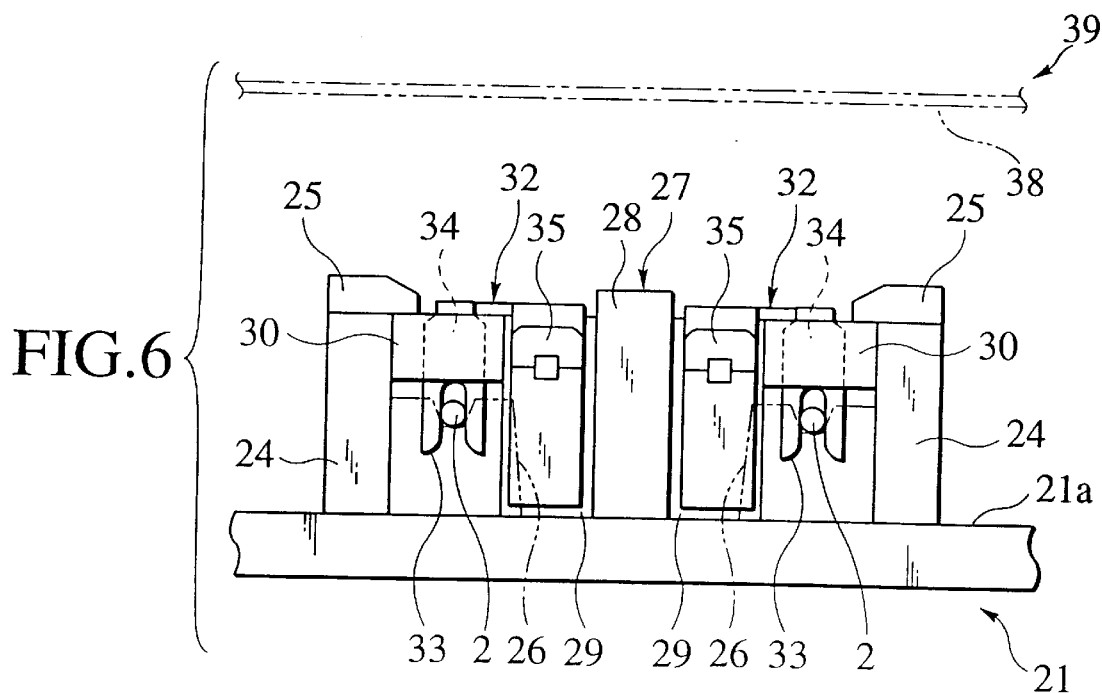
FIG. 6 is side view showing the structure of the light emitting diode of FIG. 5.
Figure 7:
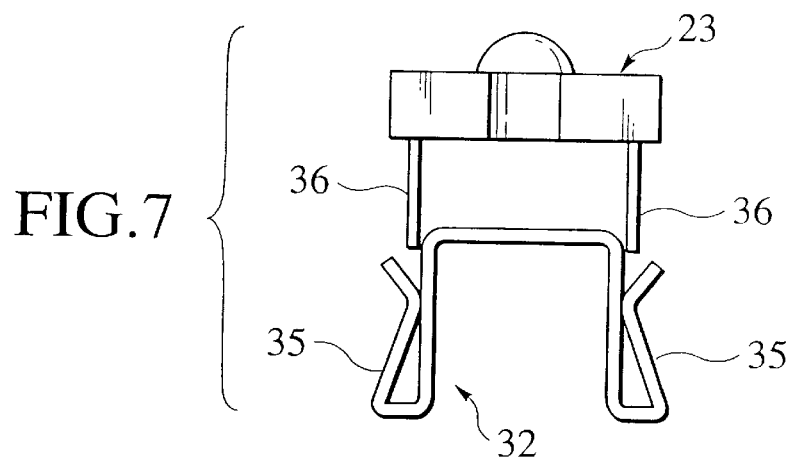
FIG. 7 is a cross-section view showing the connecting member and the clip part of the light emitting diode of FIG. 5.

FIG. 5 shows one of the plurality of mounting surfaces 21a. Two wires 2 are disposed on the mounting surface so as to be mutually parallel, and a light emitting diode 23 is mounted in place over the wires 2. The wires 2 each are formed by a center conductor 2a and an insulation covering 2b that covers the center conductor 2a.

Two walls 24 in mutual opposition to each other are formed on the mounting surface 21a. Mutually opposing tabs 25 are formed at the top edges of the walls 24. Bases 26 are formed so as to face the inside from both ends of the walls 24, and the wires 2 are supported on these bases 26. The holder 27 is made up of a center block 28, protrusions 29 that protrude from the surfaces at each side of the center blocks 28, and upper pieces 30 disposed at the top edges of the protrusions 29, these being integrally formed as a molded resin piece. The upper pieces 30 have formed in them a pair of insertion holes 31.

The connecting members 32 are pressed from sheet metal, and two of these connecting members are mounted to one holder 27. The connecting members 32 have an integrally formed foot parts 34 with a cutting groove 33 in the ends thereof, and integrally formed clip parts 35 which are formed by bending back the sheet metal material. Four leads 36 extend from the four corners of the light emitting diode 3, these leads being formed from copper, which has good thermal conductivity.

The process of mounting a light emitting diode 23 in place in this embodiment is as follows.

First, with the wires 2 disposed over the bases 26, the holder 27 is inserted between the two walls 24. By doing this, the upper pieces 30 of the holders 27 engage with the tabs 25 at the upper edges of the walls 24, so that the holder 27 is held in place with respect to the housing 12 with a single operation. The wires 2 are disposed between the bases 26 and the upper pieces 30.

Next, the connecting members 32 are mounted to the holder 27. More specifically, the clips 35 are pushed onto the protrusions 29 of the holder 27, so that the foot parts 34 are inserted into the insertion holes 31 of the upper pieces 30. The upper part of the foot parts 34 are hidden within the upper pieces 30 of the holder 27, but the clip parts 35 are totally exposed to outside the holder 27.

Figure 8:
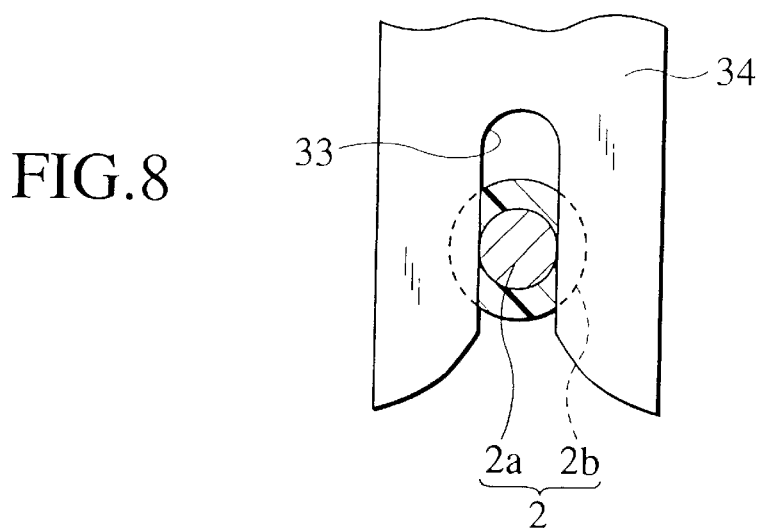
FIG. 8 is a cross-section view showing the cutting groove of FIG. 5.

When the connecting members 32 are inserted with respect to the holder 27, the cutting grooves 33 in the ends of the foot parts 34 cut the insulation covering 2b of the wires 2, thereby biting into the insulation covering 2b so as to engage with the center conductor 2a therewithin (refer to FIG. 8). By doing this, an electrically conducting connection is made between the connecting members 32 and the wire 2. The biting force between the cutting grooves 33 and the wire 2 holds the connecting members 32 in place with respect to the holder 27. The wires 2 are supported from below by the bases 26, making is possible to perform the task of pressing into the cutting grooves 33.

Finally, the four leads 36 of the light emitting diode 23 are each inserted into the clip parts 35 of each of the connecting members 32. The leads 36 are grabbed and held by these clip parts 35, so that the grabbing force of the clip parts 35 provides the holding force.

In this manner, by simply inserting the leads 36 into the connecting members 32 that are held by the holder 27, the need to perform a soldering operation is eliminated, thereby simplifying the mounting task, improving the manufacturing efficiency, and enabling automation thereof. Additionally, replacement of the light emitting diode 23 is enabled. Because the light emitting diode 23 is held by the four leads 36, it does not tend to bend over after mounting, nor does the orientation of the light emitting diode 23 tend to change. Additionally, because the light emitting diode 23 is held in place by two connecting members 32, it is possible to make each of the connecting members 32 small, thereby facilitating manufacture hereof.

The connecting members 32 are stably held to the mounting surface 21a of the housing 21, and the light emitting diode 23 is held in place with respect to the housing 21 by the action of the clip parts 35 of the connecting members 32 resiliently holding and supporting the leads 36 thereof. For this reason, the light emitting diode 23 is held securely in place with respect to the housing 21, and the light axis thereof is held stable. Because the light axis of the light emitting diode 23 is stabilized in this manner, there is an improvement in the usage of the light therefrom. For this reason, the number of light emitting diodes required to achieve the desired brightness is reduced in comparison with the related art, thereby simplifying the structure and reducing the cost.

Additionally, because the clip parts 35 are totally exposed from the holder 27, heat generated from the light emitting diode 23 can be radiated from the clip parts 35, thereby improving the heat radiation performance of the light emitting diode 23. Because the leads 36 of the light emitting diode 23 are made of copper, which has a high thermal conductivity, heat generated by the light emitting diode 23 is reliably transmitted via the leads 36 to the connecting parts 32, thereby providing a further improvement in radiation of heat from the light emitting diode 23.

The housing 21 has a plurality of mounting surfaces 21a that are disposed in three-dimensionally skewed levels so as to follow the shape of the stop lamp 39. By thusly disposing each light emitting diode 23 in a positional that is optimal with respect to the lens 38 of the stop lamp 39, there is a further improvement in the efficiency use of the light from the light emitting diodes 23.

What is claimed is:

1. A light emitting diode mounting structure comprising:
   a light emitting diode having a lead;
   a non-metallic holder engaging with a housing; and
   a metal connecting member mounted to the holder, the connecting member having an integrally formed foot part and clip part, the lead being grabbed in and supported by the clip part, the foot part having a cutting groove for accepting the wire on the housing, the wire comprising an insulation covering and a center conductor disposed within the insulation covering, and when the wire is inserted into the cutting groove, the cutting groove cutting the insulation covering and biting into the inside thereof, forming an electrically conductive contact between the connecting member and the center conductor and holding the wire in place.

2. A light emitting diode mounting structure according to claim 1, wherein the light emitting diode comprises four leads, two connecting members are mounted in mutual proximity to the holder, each connecting member comprises a clip part, and the four leads are each grabbed and supported by the clip parts.

3. A light emitting diode mounting structure according to claim 2, wherein each connecting member comprises two cutting grooves.

4. A light emitting diode mounting structure according to claim 1, wherein the clip part is exposed from the holder.

5. A light emitting diode mounting structure according to claim 4, wherein the lead is formed of a metal having a thermal conductivity equivalent to or greater than that of copper.

6. A vehicular lamp comprising:
   a housing disposed inside a lens and comprising a plurality of mounting surfaces disposed so as to follow a contour of the lens;
   a light emitting diode comprising a lead and disposed on each mounting surface;
   a non-metallic holder engaging the housing and fixed to each mounting surface, and
   a metal connecting member mounted to the holder, the connecting member having an integrally formed foot part and clip part, the lead being grabbed in and supported by the clip part, the foot part having a cutting groove for accepting the wire on the housing, the wire comprising an insulation covering and a center conductor disposed within the insulation covering, and when the wire is inserted into the cutting groove, the cutting groove cutting the insulation covering and biting into the inside thereof, forming an electrically conductive contact between the connecting member and the center conductor and holding the wire in place.

* * * * *